United States Patent
Laurin et al.

(10) Patent No.: US 6,830,951 B2
(45) Date of Patent: *Dec. 14, 2004

(54) INTEGRATED SEMICONDUCTOR LIGHT SENSOR DEVICE AND CORRESPONDING MANUFACTURING PROCESS

(75) Inventors: Enrico Laurin, Lissone (IT); Matteo Bordogna, Bellusco (IT); Oreste Bernardi, Sangiorgio Piacentino (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

This patent is subject to a terminal disclaimer.

(21) Appl. No.: 10/252,952

(22) Filed: Sep. 23, 2002

(65) Prior Publication Data

US 2003/0087486 A1 May 8, 2003

Related U.S. Application Data

(63) Continuation of application No. 09/362,427, filed on Jul. 28, 1999, now abandoned.

(30) Foreign Application Priority Data

Jul. 28, 1998 (FR) .............................. 98 09801

(51) Int. Cl.[7] .............................................. H01L 21/00
(52) U.S. Cl. .............................. 438/69; 438/70; 438/71
(58) Field of Search .............................. 438/69, 70–81, 438/85–86; 257/414, 431–437

(56) References Cited

U.S. PATENT DOCUMENTS

| | | | |
|---|---|---|---|
| 4,242,694 A | * | 12/1980 | Koike et al. ................. 257/294 |
| 4,407,010 A | | 9/1983 | Baji et al. |
| 4,996,578 A | | 2/1991 | Motojima et al. |
| 5,084,747 A | | 1/1992 | Miyawaki |
| 5,237,185 A | | 8/1993 | Udagawa et al. |
| 5,268,309 A | | 12/1993 | Mizutani et al. |
| 5,502,488 A | | 3/1996 | Nagasaki et al. |
| 5,614,744 A | | 3/1997 | Merrill |
| 5,801,373 A | * | 9/1998 | Oozu et al. ............... 250/208.1 |
| 5,945,722 A | | 8/1999 | Tsuei et al. |
| 6,019,848 A | | 2/2000 | Frankel et al. |
| 6,049,118 A | | 4/2000 | Nagano |
| 6,150,683 A | | 11/2000 | Merrill et al. |
| 6,160,282 A | | 12/2000 | Merrill |
| 6,352,876 B1 | * | 3/2002 | Bordogna et al. ............. 438/69 |
| 6,538,237 B1 | * | 3/2003 | Yang et al. .................. 219/390 |

FOREIGN PATENT DOCUMENTS

| EP | 0 152 353 A | 8/1985 |
|---|---|---|
| EP | 0 223 136 A | 5/1987 |

OTHER PUBLICATIONS

French Search Report from French Patent Application 98 09801, filed Jul. 28, 1998.
Patent Abstracts of Japan, vol. 009, No. 262 (P–398), Oct. 19, 1985 & JP–A–60 111225 (Matsushita Denki Sangyo KK).
Text of co–pending U. S. patent application Ser. No. 09/361, 700 filed on Jul. 29, 1999 entitled Image Sensor with a Photodiode Array and the claims as currently pending.

* cited by examiner

*Primary Examiner*—Dung A. Le
(74) *Attorney, Agent, or Firm*—Lisa K. Jorgenson; James H. Morris; Wolf, Greenfield & Sacks, P.C.

(57) ABSTRACT

The invention relates to a process for manufacturing a light sensor device in a standard CMOS process, including at least the following phases: implanting active areas on a semiconductor substrate to obtain at least a first, a second and a third integrated region of corresponding photosensors; forming a stack of layers of different thickness and refractive index layers over the photosensors to provide an interferential filter for said photosensors. The stack is obtained by a deposition of a first oxide stack including a first, a second and a third oxide layer over at least one photosensor; moreover, this third oxide layer is obtained by a deposition step of an protecting undoped premetal dielectric layer.

18 Claims, 2 Drawing Sheets

INTEGRATED SEMICONDUCTOR LIGHT SENSOR DEVICE AND CORRESPONDING MANUFACTURING PROCESS

This application is a continuation of prior application Ser. No.: 09/362,427, filed on Jul. 28, 1999, entitled INTEGRATED SEMICONDUCTOR LIGHT SENSOR DEVICE AND CORRESPONDING MANUFACTURING PROCESS and now abandoned.

FIELD OF THE INVENTION

The present invention relates to an integrated semiconductor light sensor device and to a corresponding manufacturing process.

More specifically, the invention relates to process for manufacturing a matrix of integrated colour sensitive photosensors for colour images, for instance for colour images or a colour television camera.

BACKGROUND OF THE INVENTION

As is well known, optical light sensors based on semiconductor properties are widely used for several video image applications.

Various techniques may be used for optical to electrical conversion. One of the most effective is based on electron-hole generation due to the light absorption of a semiconductor reverse biased photodiode.

Since the final effect of the electron-hole generation doesn't represent the wavelength of the absorbed light in the optical range, this physical mechanism cannot distinguish different colours.

To implement colour sensitivity a series of coloured filters is generally provided between the light source and the photosensitive device.

This is usually implemented by a deposition of an organic coloured resin over the finished semiconductor photosensitive device. This resin stops by absorption all the unwanted colours of the incident light and transmits to the light sensor just the light wavelengths to be selected. In this manner the electric signal generated in the semiconductor device is correlated to the selected colour only.

The photodiodes are integrated on silicon to form a bidimensional matrix. From the top view each diode looks squared with sides of about 5 $\mu$. Each diode is electrically insulated from the other adjacent diodes by an isolation region, for instance field oxide.

To clearly detect colour images, the semiconductor matrix includes at least three different kind of staggered diodes, which are sensitive to blue, green and red light respectively.

The main drawback of the photodiodes covered by the organic resin is due to the fact that the manufacturing process step for the resin deposition is a further process step and that the filter absorbs a portion of the incident light reducing the diode sensitivity. Moreover, long exposure to intense light and high temperature may reduce the ability of the organic resins to stop the unwanted colours.

A better prior art solution for providing colour selectivity is disclosed in the European patent No. 0152353 which relates to method and device for obtaining a colour selecting effect based on the wave properties of the light. This method may be implemented during the semiconductor device manufacturing process instead than on the finished sensor.

Very briefly, this method provides the deposition of a stack of inorganic layers over the light sensor device. These layers have suitable thicknesses and indexes of refraction.

By a suitable definition of the stack structure it is possible to obtain the desired spectral transmission of the incident light toward the semiconductor sensor device.

Modulating the interference of the light waves reflected at all the layers interfaces of the stack it is possible to maximize or minimize the light intensity transmitted or reflected by the whole stack in pre-determined wavelength ranges, that is colours.

The method disclosed in the above cited European patent is based on the construction of an optical resonant semiconductor stack formed by the following layers: Monosilicon—Oxide—Polysilicon with the oxide thickness equal to L/2, where L is a given wavelength of the incident light.

The incident light is reflected by the interface monosilicon/oxide and interferes with the light reflected by the other interface oxide/polysilicon. Significant reflection of these interfaces takes place due to the high step of refraction index: N_oxide=1.45/N_silicon=4.

Just the waves having wavelength L, which is the double of the oxide thickness d, exhibit a constructive interference. For wavelengths different from L the phase shift L/2 gradually changes causing reflection to increase and transmission to decrease. The result is a transmission curve of the type "pass-band filter" centered at the wavelength L.

For instance, interferential L/2 resonators selecting transmission for Blue, Green and Red light must have the following thicknesses of silicon oxide (which is the L/2 layer) deposited directly on the active areas of a monosilicon layer hosting the photosensitive diodes:

Blue ⇒1500 Å
Green ⇒1900 Å
Red ⇒2300 Å

Above the oxide layer a thin polysilicon layer (200 Å) is deposited. Then a further layer of silicon nitride (500 Å) is provided over the polysilicon.

Above the nitride layer a standard isolation and passivation oxide layers may be deposited according to the usual CMOS process.

The nitride layer is used to eliminate an additional unwanted interference of reflected light that would occur between the polysilicon and isolation oxide interface. The intermediate nitride refraction index (N_nitride=2) makes negligible the fraction of light intensity reflected at its interfaces.

Now, according to what above, in a standard CMOS process flow the deposition of the three stacks (L/2 Oxide-Polysilicon-Nitride) is performed after the source/drain implantation of the photodiode active area, just before the poly to metal dielectric deposition.

The deposition of the first oxide layer for the interferential filter requires specific process steps since various oxide layers having different thickness must be defined to assure a filtering effect according to a specific light wavelength. To form the oxide layers selecting the three wanted colours, at least a first, a second and a third oxide deposition are required.

The aim of the present invention is that of reducing the complexity of the process steps required to obtain the interferential filter.

A further object of the present invention is that of obtaining a third oxide layer having a thickness multiple of the L/2 value; so a layer having a thickness of L may also be obtained.

A further aim of the invention is that of rendering simpler the final etching step allowing the use of a single etching apparatus just for the polysilicon layer etching step.

SUMMARY OF THE INVENTION

The solution idea behind the present invention is that of using a protecting dielectric, for instance a premetal dielectric, as the third layer of the interferential filter.

According to this solution idea, the invention relates to process for manufacturing a light sensor device in a standard CMOS process, including at least the following phases:

implanting active areas on a semiconductor substrate to obtain at least a first, a second and a third integrated region of corresponding photosensors;

forming a stack of layers having different thickness and refractive index over said photosensors to provide an interferential filter for said photosensors;

wherein:

said stack of layers having different thickness and refractive index is obtained by a deposition of a first oxide stack including at least a first, a second and a third oxide layer over at least one photosensor;

said third oxide layer being obtained by a deposition step of an protecting premetal dielectric layer.

The features and advantages of the invention will become apparent from the following description of an embodiment thereof, given by way of non-limiting example with reference to the accompanying drawings.

DETAILED DESCRIPTION

Figure 1:
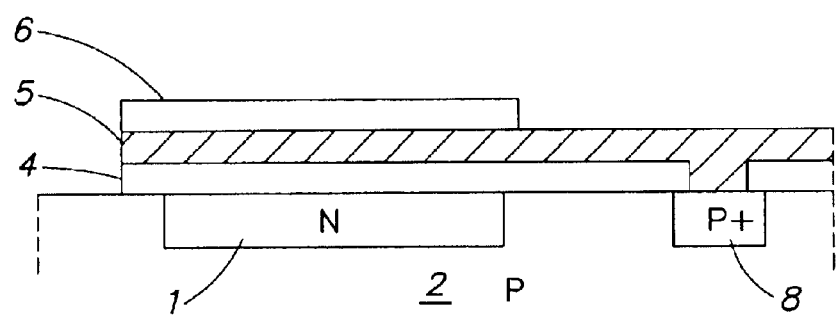
FIG. 1 is a schematic view of a vertical cross section of a semiconductor portion including a light sensor device manufactured according to the present invention.

With reference to the drawing figures, generally and schematically shown in FIG. 1 is a light sensor device 1 including an interferential coloured filter 9 according to the present invention.

The process steps and the structures described herein below do not form a complete process flow for manufacturing integrated circuits. In fact, this invention can be practiced jointly with integrated circuit manufacturing techniques currently used in the art, and only those common process steps will be discussed herein as are necessary to an understanding of the invention.

The drawing figures which show cross-sections through a semiconductor wafer are not drawn to scale but rather to highlight major features of the invention.

The light sensor device 1 is substantially an integrated photodiode which is realized over a semiconductor substrate 2 region of a first conductivity type, for instance a P doped semiconductor region.

This semiconductor substrate 2 hosts other Complementary Metal Oxide Semiconductor (CMOS) circuitry, which is realized according to a standard CMOS process flow.

The substrate 2 is formed by monocristalline silicon and will be disclosed hereinafter as a monosilicon substrate.

The photodiode 1 comprises a region having an N type dopant concentration, opposite to the substrate.

Over the region 1 there is a stack formed by a multilayer structure including a high refractive index dielectric layer, such as a silicon oxide layer 4, a conductive layer 5, for instance a polysilicon layer, possibly conductive, and a further semiconductor layer 6 formed by a silicon nitride layer.

The stack including the layers 4, 5 and 6 above monosilicon 1, has different thickness and refractive index and represents the interferential filter 9.

The monosilicon and polysilicon layers 1, 5 have a high refraction index, about 4, while the silicon oxide layer 4 and the silicon nitride layer 6 have a low refraction index, about 1.5–2.0.

As known from EP 0152353, the thickness of the various layers must be defined to assure an anti-reflection effect and a filtering effect according to a specific light wavelength.

For instance, if the thickness of the layers 5 and 6 is 20 and 50 nm respectively, then the stack forms a filter for the Blue colour if the thickness of the oxide layer 4 is chosen of about 150 nm.

A filter for the Green colour may be formed choosing an oxide layer thickness of 190 nm; while a Red colour filter may be formed with an oxide layer having thickness of 230 nm.

A preferred embodiment of the invention provides for a P+ contact region 8 to allow an electric contact between the polysilicon layer 5 and the substrate 2.

Figure 2:
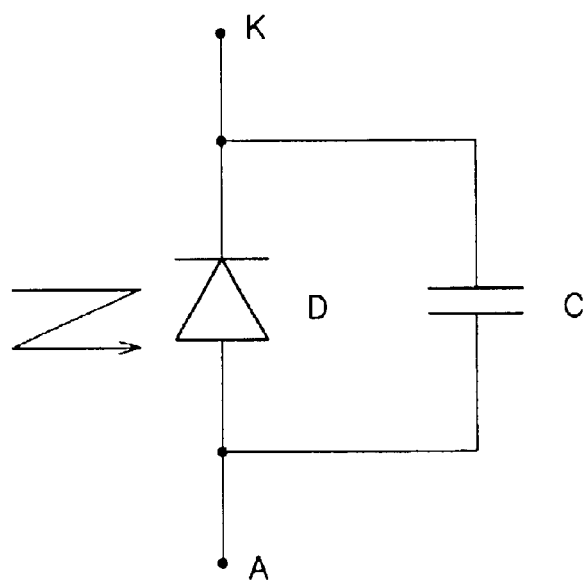
FIG. 2 is a schematic view of an electric equivalent of the device shown in FIG. 1.

The equivalent circuit shown in FIG. 2 allows to identify the photodiode D cathode region 1 which is represented by a circuit node K. The photodiode anode is connected to a circuit node A connected to a ground reference potential; that is to the substrate potential.

If conductive polysilicon is used as layer 5, a capacitor C may be connected in parallel to the photodiode D. A first plate of this capacitor C is the polysilicon layer 5 connected to the substrate, while a second plate of the capacitor corresponds to the cathode region 1.

The presence of the capacitor C improves the photodiode charge storage capability.

With specific reference to the examples of the Figures from 3 to 5, the process according to the present invention is now disclosed.

Figure 3:
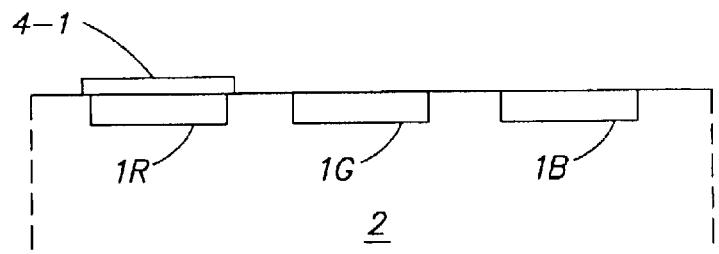
FIG. 3 is a schematic view of a vertical cross section of a semiconductor portion at the beginning of the inventive manufacturing process.

FIG. 3 shows a monosilicon semiconductor portion 2 comprising three different diode cathode regions 1R, 1G, 1B, respectively. These regions will be sensible to Red, Green and Blue colours respectively.

These regions 1R, 1G, 1B are defined by a photolithographic process step that provided for a resist deposition and etching steps followed by a Source/Drain implantation of the diodes active areas uncovered by dielectric, as in a standard CMOS process.

According to the inventive process, silicon oxide layers having different thickness are deposited over these three regions 1R, 1G, 1B.

A first process step shown in FIG. 3 provides for the deposition of a first oxide layer 4-1 just over the first cathode region 1R.

More specifically, a blanket oxide deposition is performed over the substrate 2 surface. Then a mask is provided to protect the area of the cathode region 1R where the Red photosensor must be formed. A subsequent oxide etching and resist mask removal clears the area out from region 1R.

The oxide thickness is preferably of 400 Å (40 nm).

Figure 4:
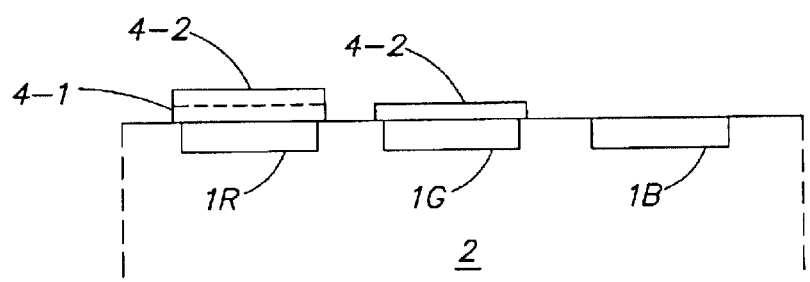
FIG. 4 is a schematic view of a vertical cross section of a semiconductor portion during further process step of the manufacturing process according to the present invention.

A further process step is then performed to cover with a second oxide layer 4-2 the second cathode region 1G and the first oxide layer 4-1, as clearly shown in FIG. 4.

Again, a 400 Å (40 nm) blanket oxide deposition is performed over the semiconductor. A mask is provided to protect the area of the cathode regions 1R and 1G where the Red and the Green photosensors must be formed. A subsequent oxide etching and resist mask removal clears the area out from regions 1R and 1G.

Figure 5:
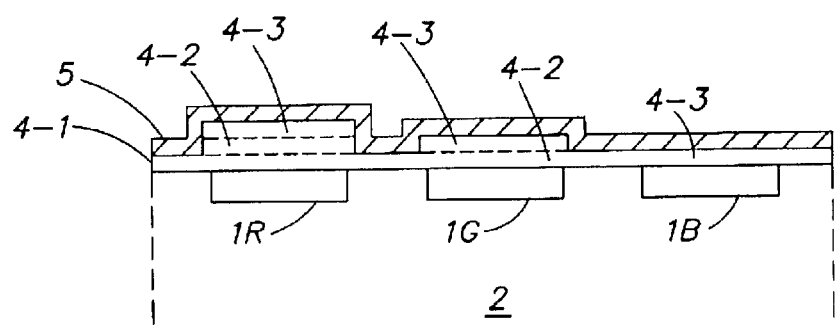
FIG. 5 is a schematic view of a vertical cross section of a semiconductor portion including at least three photodiodes obtained with the manufacturing process according to the invention.

The inventive process is proceeded with a further oxide deposition step to cover with a third oxide layer 4-3 the whole semiconductor portion shown in FIG. 5.

Advantageously, this further oxide layer 4-3 is an protecting (undoped) dielectric layer, for instance a Undoped Silica Glass (USG) type layer, which is normally used as a premetal dielectric over a polysilicon layer. In standard Complementary Metal Oxide Silicon (CMOS) processes the premetal dielectric (which is the insulator deposited before metal interconnections) is generally a stack of a first protecting dielectric, undoped and not planarizing, followed by a second planarizing dielectric (usually doped).

This third oxide layer has a thickness of 1500 Å (150 nm) and is not etched between two adjacent photosensors. This allows obtaining a better planarized structure even if the USG oxide is a conformal layer.

Moreover, the thickness of this third oxide layer may be regulated according to the needs to bring the total thickness of the oxide stacks to a value multiple of the L/2. For instance, it's possible to obtain a layer thickness of nL/2, where n may be an integer $\geq 2$.

Therefore, over the region 1R the oxide thickness is 230 nm; over the region 1G the oxide thickness is 190 nm and over the region 1B the oxide thickness is just 150 nm.

Then a thin polysilicon layer 5 is deposited over the third oxide layer 4-3. Preferably, the thickness of this polysilicon layer is about 200 Å.

The inventive process is proceeded with a further deposition step of an optional silicon nitride layer 6.

A 500 Å nitride blanket deposition is performed over the polysilicon layer 5. Then a photoresist mask is provided to protect the Red, Green and Blue sensors regions 1R, 1G and 1B.

An etching step is performed to remove the nitride layer 6 and the poly layer 5 out of the regions 1R, 1G and 1B. Then the photoresist mask is removed too.

The third USG oxide layer 4-3 is not etched thus avoiding a possible overetch and related field oxide consumption with a possible active areas widening on the CMOS circuitry and the consequent reduction of the insulating capability of the field oxide.

At this point the three L/2 stacks are defined over the diode sensors while the active areas of other CMOS circuitry integrated on the same semiconductor substrate 2 remain already covered by the protecting (undoped) dielectric layer 4-3 which is not removed by the last etching step.

A final process step is then performed to provide a metal dielectric deposition of a Boron Phosphorous Silica Glass (BPSG) planarizing layer to provide the second planarizing dielectric layer.

The process according to the present invention allows a reduction of a process step if compared with the current prior art solutions. The main advantage of the inventive process is given by the use of the protecting (undoped) premetal dielectric layer as the third layer of the interferential filter.

This also means that the final etching step is simpler since a single etching apparatus is needed just for the silicon nitride and the polysilicon layer etching step.

A further advantage is given by the possibility offered by the invention to realize a third oxide layer having a thickness multiple of the L/2 value; so a layer having a thickness of L may also be obtained.

A further advantage is given by the fact that the threshold of some parasitic component is increased thereby reducing their influence on the photosensor operation.

What is claim is:

1. A process for manufacturing a light sensor device by a standard Complementary Metal Oxide Semiconductor (CMOS) process, comprising:

implanting active areas on a semiconductor substrate to obtain at least a first, a second, and a third integrated region of corresponding photosensors;

forming a stack of layers having different thickness and refractive index over said photosensors to provide an interferential for said photosensors; said stack of layers having different thickness and refractive index is obtained by a deposition of a first oxide stack including at least a first, a second and a third oxide layer over at least one photosensor, said third oxide layer being obtained by a deposition step of a protecting premetal dielectric layer/and said stack of layers has a thickness value of a multiple of L/2, wherein L is a given wavelength of the incident light that is wanted to be transmitted to the sensor.

2. The process of claim 1, wherein said premetal dielectric layer is undoped.

3. The process of claim 1, wherein said premetal dielectric layer is a conformal Undoped Silica Glass (USG).

4. The process of claim 1, wherein said third oxide layer is not etched between two adjacent photosensors.

5. The process of claim 1, wherein a thin conductive layer is deposited over said third oxide layer.

6. The process of claim 1, wherein said thin conductive layer is polysilicon.

7. The process of claim 1, wherein a further deposition step of a silicon nitride layer is provided over said thin conductive layer.

8. The process of claim 7, wherein a final planarization step is performed by a deposition of a single planarizing metal dielectric layer.

9. The process of claim 8, wherein said single planarizing metal dielectric layer is Boron Phosphorus Silica Glass (BPSG).

10. A process for manuracturing a light sensor device by a standard Complementary Metal Oxide Semiconductor (CMOS) process, comprising:

implanting active areas on a semiconductor substrate to obtain at least a first, a second, and a third intergrated region of corresponding photosensors;

forming a stack of layers having different thickness and refractive index over said photosensors to provide an interferential filter for said photosensors; said stack of layers having different thickness and refractive index is obtained by a deposition of a first oxide stack including at least a first, a second and a third oxide layer over at least one photo sensor, said third oxide layer being obtained by a deposition step of a protecting premetal dielectric layer/wherein said stack of oxide layers has a thickness of about 1500 Å (150 nm).

11. A process for manufacturing a light sensor device, comprising:

implanting active areas on a semiconductor substrate to obtain at least a first, a second, and a third integrated region of corresponding photosensors; and forming a stack of layers having different thicknesses and refractive index over said photosensors to provide an inferential filter for said photosensors by depositing a first oxide stack including at least a first, a second, and a third oxide layer over at least one photosensor, said third oxide layer being obtained by a deposition step of a protecting premetal dielectric layer/said stack of layers formed having a thickness value of a multiple of L/2, wherein L is a given wavelength of the incident light that is wanted to be transmitted to the sensor.

12. A process for manufacturing an integrated sensor device sensitive to multiple wavelengths of the electromagnetic spectrum, comprising:

implanting three active areas on a semiconductor substrate to obtain a first, a second and a third integrated wavelength sensor;

forming a first interferential filter over the first wavelength sensor by forming a premetal dielectric layer having a first thickness;

forming a second interferential filter over the second wavelength sensor by forming the premetal dielectric layer over a second layer of material, the second interferential filter having a second thickness;

forming a third interferential filter over the third wavelength sensor by forming the premetal dielectric layer over the second layer and a third layer of material, the third interferential filter having a third thickness, wherein the first, second, and third thicknesses are multiples of L/2, where L is a given wavelength of the electromagnetic spectrum that is desired to be transmitted to the respective first second and third wavelength sensors.

13. The process of claim 12, wherein forming a premetal dielectric layer comprises depositing an undoped premetal dielectric layer.

14. The process of claim 12, wherein forming a premetal dielectric layer comprises forming a conformal Undoped Silica Glass (USG) layer.

15. The process of claim 12, wherein forming first interferential filter comprises forming an interferential filter having a thickness of approximately 150 nm.

16. The process of claim 12, wherein forming a second interferential filter comprises forming an interferential filter having a thickness of approximately 190mm.

17. The process of claim 12, wherein forming a third interferential filter comprises forming an interferential filter having a thickness of approximately 230 nm.

18. The process of claim 12, wherein forming the premetal dielectric layer includes preventing etching the premetal dielectric layer between the first, second, and third integrated wavelength sensor.

* * * * *